(12) United States Patent
Olsen (10) Patent No.: US 12,316,312 B2
(45) Date of Patent: May 27, 2025

(54) POWER GATING FOR MULTIPLE BACKSIDE VOLTAGE PLANES

(71) Applicant: Intel Corporation, Santa Clara, CA (US)

(72) Inventor: Scott A. Olsen, Gales Creek, OR (US)

(73) Assignee: Intel Corporation, Santa Clara, CA (US)

( * ) Notice: Subject to any disclaimer, the term of this patent is extended or adjusted under 35 U.S.C. 154(b) by 1298 days.

(21) Appl. No.: 15/943,530

(22) Filed: Apr. 2, 2018

(65) Prior Publication Data
US 2019/0305773 A1    Oct. 3, 2019

(51) Int. Cl.
| | |
|---|---|
| H01L 23/528 | (2006.01) |
| G06F 1/3234 | (2019.01) |
| H03K 17/687 | (2006.01) |
| H10D 84/01 | (2025.01) |
| H10D 84/03 | (2025.01) |
| H10D 84/85 | (2025.01) |

(52) U.S. Cl.
CPC ....... *H03K 17/6872* (2013.01); *G06F 1/3275* (2013.01); *H01L 23/5286* (2013.01); *H10D 84/0186* (2025.01); *H10D 84/038* (2025.01); *H10D 84/85* (2025.01)

(58) Field of Classification Search
CPC ... H01L 27/085; H01L 27/088; H01L 27/092; G06F 1/3275
See application file for complete search history.

(56) References Cited

U.S. PATENT DOCUMENTS

| | | | | |
|---|---|---|---|---|
| 7,737,770 B2* | 6/2010 | Kuhn | .................... | H01L 27/088 327/544 |
| 2015/0348962 A1* | 12/2015 | Chao | .................... | H01L 23/50 257/207 |
| 2018/0366422 A1* | 12/2018 | Matsubara | .......... | H01L 29/7827 |

* cited by examiner

*Primary Examiner* — Patrick C Chen
(74) *Attorney, Agent, or Firm* — Schwabe, Williamson & Wyatt P.C.

(57) ABSTRACT

Power gating for multiple backside voltage planes is described. For example, an integrated circuit (IC) may include a power gate that includes a first transistor having a first source diffusion that includes a first input terminal and a first drain diffusion that includes a first output terminal; a second transistor having a second source diffusion that includes a second input terminal and a second drain diffusion that includes a second output terminal; a gate between the first source and drain diffusions, and between the second source and drain diffusions; a source wire to couple the first and second input terminals; and a drain wire to couple the first and second output terminals. The IC may include an input power wire, an output power wire, and first and second vias to couple, respectively, the input power wire with the first input terminal and the second output terminal with the output power wire.

15 Claims, 5 Drawing Sheets

POWER GATING FOR MULTIPLE BACKSIDE VOLTAGE PLANES

TECHNICAL FIELD

Embodiments of the present disclosure relate to the field of semiconductor devices and processing and, in particular, power gating for multiple backside voltage planes.

BACKGROUND

For the past several decades, the scaling of features in integrated circuits (IC) has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Certain aspects of semiconductor device design may be related to minimizing power usage during, for example, a system standby or system idle state. One technique that may be used to minimize power usage in a standby or an idle state is power gating, where power is turned off to parts of a semiconductor device that are not in use. As with other aspects of semiconductor device design, providing a power gating mechanism may have an impact on, among other things, the limited real estate available on semiconductor chips and functional lifespan.

BRIEF DESCRIPTION OF THE DRAWINGS

Embodiments will be readily understood by the following detailed description in conjunction with the accompanying drawings. To facilitate this description, like reference numerals designate like structural elements or components. Embodiments are illustrated by way of example and not by way of limitation in the figures of the accompanying drawings.

FIGS. 1A, 1B, 1C, and 1D illustrate components of an IC that includes power gates in accordance with various embodiments, where:

FIGS. 2A, 2B, 2C, and 2D illustrate components of another IC that includes power gates in accordance with various embodiments, where:

DESCRIPTION OF THE EMBODIMENTS

Power gating for multiple backside voltage planes is described. The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc., in order to provide a thorough understanding of the various aspects of the claimed embodiments. However, it will be apparent to those skilled in the art having the benefit of the present disclosure that the various aspects of the embodiments claimed may be practiced in other examples that depart from these specific details. In certain instances, descriptions of well-known devices, circuits, integrated circuit design layouts, and methods are omitted or simplified so as not to obscure the description of embodiments of the present disclosure with unnecessary detail. Furthermore, it is to be understood that the various embodiments shown in the Figures are illustrative representations and are not necessarily drawn to scale. For example, the thickness of substrates, layers, regions, etc., may be exaggerated for clarity. Further, it is to be understood that the various embodiments shown in the Figures may include elements that are present but may be hidden from view in a particular Figure or Figures.

Various aspects of the illustrative embodiments may be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations may be set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

The phrase "in an embodiment," "in embodiments," "in various embodiments," "in some embodiments," and the like are used repeatedly. The phrase generally does not refer to the same embodiments; however, it may, and thus may refer to one or more of the same or different embodiments. The terms "comprising," "having," and "including" are synonymous, unless the context dictates otherwise. The phrase "A or B" means (A), (B), or (A and B).

The following description may use certain terminology for the purpose of reference only, and thus are not intended to be limiting. For example, perspective-based descriptions such as "upper", "lower", "above", and "below", and "under" may refer to directions in the drawings to which reference is made. For another example, terms such as "front", "back", "top", "bottom", "rear", and "side" may describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Such descriptions are merely used to facilitate the discussion and are not intended to restrict the application of embodiments described herein to any particular orientation.

The term "coupled with" or "coupled to," along with their derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

It will be understood that when an element, such as, for example, a layer, region, or substrate, is referred to as being "on" another element, it may be directly on the other element or intervening elements may also be present. Further, it will be understood that when the element is referred to as being "on" another element, it may be "on" the other element regardless of whether the elements are in a vertical orientation, a horizontal orientation, or an angled orientation. Further, to say that a first feature is formed, deposited, or otherwise disposed on or otherwise on, a second feature, may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Various operations may be described as multiple discrete operations, in turn, in a manner that is most helpful in understanding the illustrative embodiments; however, the order of description should not be construed as to imply that these operations are necessarily order dependent. In particular, these operations need not be performed in the order of presentation. Further, example embodiments may be described as a process or operation flow depicted as a flowchart, a flow diagram, a data flow diagram, a structure diagram, or a block diagram. Although a flowchart may describe the operations as a sequential process or operation flow, many of the operations may be performed in parallel, concurrently, or simultaneously. In addition, the order of the operations may be re-arranged. A process or operation flow may be terminated when its operations are completed, but may also have additional operations not included in the figure(s). A process or operation flow may correspond to a method, a function, a procedure, a subroutine, a subprogram, and the like. When a process or operation flow corresponds to a function, its termination may correspond to a return of the function to the calling function and/or the main function.

Embodiments may include power gating for multiple backside voltage planes. A power distribution (or delivery) network (PDN) on an IC, which may be referred to as an on-chip PDN, may include an off-chip or on-chip alternating current-to-direct current (AC-to-DC) converter, an off-chip or on-chip DC-to-DC converter, and the IC, which may include one or more cores that may be referred to as one or more modules. The AC-to-DC converter may get power from an external voltage source and convert AC current to a high-voltage DC current. The voltage source, which may be referred to as global power or a global power plane, may include a supply voltage, which may be referred to as Vcc. The DC current may be provided to the DC-to-DC converter, which may convert the high-voltage DC current to a low-voltage DC current, to provide power used by the cores, which may be referred to as local power or a local power plane. The PDN may further include one or more wires, which may be referred to as a transmission line or lines, or other interconnects in the power supply path from the global power to the local power to the cores of an IC. The PDN may further include a voltage ground, which may be referred to as Vss, which may provide a ground for the global power or the local power.

Embodiments herein may include on-chip power gates to turn off global power to an IC or cores of an IC. Power gating may be a mechanism to turn off global power to the IC, to cores of the IC, or to subcomponents of the IC, when the IC, cores, or subcomponents are not in an active mode. Accordingly, powering an IC, such as, for example, a central processing unit (CPU) or a modem, may involve power gating where different voltage planes, such as, for example, a global power plane and a local power plane, may be switchable through, for example, the use of transistors.

Transistors used to switch voltage planes may, for example, introduce a voltage droop, which may be, for example, a momentary drop in voltage as current passes through the transistor; block potential routing resources, such as, for example, the wires or other interconnects or tracks for the wires or interconnects; or introduce area penalties, which may refer to, for example, space taken up or occupied by the transistors or the routing resources, as the transistors isolate input and output power planes such as, for example, global and local power planes. For example, a transistor's source and drain on a plane or level, whether, for example, an upper plane or level, or a lower plane or level, may connect to input and output power wires that are on the same plane as each other. Due to the distance between the source and drain, smaller transistor gate lengths may require that the wires connecting to the source and drain be routed on different tracks, which may block potential routing resources and introduce area penalties. Further, voltage droop decreases as the width of a power delivery wire increases, but while the ideal size of a power wire is a wire that is as large as possible in a cell architecture, forcing two wires to connect to one transistor may, for example, reduce the allowed power wire size, possibly by more than 50%, and thus may increase voltage droop.

Embodiments herein may include input power wires and output power wires connected to different transistors and may further include current distributed in a manner that may, for example, reduce risk of reliability failure. For example, embodiments herein may enable an increase in the size of an input power wire, an output power wire, or both power wires, and a larger wire carrying the same amount of current as a small wire may be less likely to fail. Further, embodiments herein may, for example, provide for distributing current in a manner that provides multiple paths from the input power wire to the output power wire, which may increase the effective wire size. Further, embodiments herein may reduce voltage droop, and may make efficient use of routing and layers to, for example, both free up routing resources and reduce the area needed to implement backside powering. For example, embodiments herein may include power gate transistor placement, hook up, and routing that may, for example, enable a single wire to connect to the backside of each transistor in a power gating structure that includes at least two transistors. Also, for example, embodiments herein may overcome the inability to connect to the source and drain on the same transistor with large power wires due to space constraints, and large power wires may reduce voltage droop, as may decreasing the number of transitions between layers and thus decreasing the number of vias, which otherwise would add resistance and increase voltage droop. Thus, embodiments herein may include one or more structures that may reduce voltage droop and may enable larger wire pitch while simultaneously making efficient use of routing and layers to free up routing resources and may reduce the area needed to implement backside powering, which thus may contribute to the ability to reduce the size of ICs, and may increase frequency, given that reducing voltage droop may increase reliability, which may allow the use of higher frequencies.

Further, embodiments of power gates herein may be modular, which may, for example, provide the ability to build one power gate and, for example, simply copy it next to or overlapping itself, which may increase effective size of the power gates without increasing effort and redesign. Further, embodiments of power gates herein may utilize the same amount of area as, or a substantially similar amount of area as, or less area than, a structure that connects the in and out signals to the same transistor size using double the number of lower plane wires. For example, a power gate in accordance with embodiments herein may enable the use of one larger wire, rather than using two smaller wires and needing space between those two wires, and the use of one wire may result in the use of less area. Further, for example, embodiments herein may include a local output power wire that may be aligned in a manner that may eliminate the need to add additional wires in an orthogonal direction. In addition, implementation at the top level may be done by allowing the input power to share a track with the ground wire, given that the input power wire and the ground wire may both be on a lower plane and thus allow the input power wire to share the same track on the same plane as the ground wire, which may increase layout density.

FIGS. 1A, 1B, 1C, and 1D illustrate components of an IC that includes power gates in accordance with various embodiments. IC 100, which may be, for example, a processor, such as a CPU, or a modem, may include an input power wire 102A. IC 100 may further include a power gate 105A that includes an input transistor 110A, which, along with any other transistor that may be described in connection with FIG. 1, FIG. 2, or FIG. 3, may also be referred to as a power gating transistor. The input transistor 110A, along with any other transistor that may be described in connection with FIG. 1, FIG. 2, or FIG. 3, may be any type of transistor, such as, for example, a P-type metal oxide semiconductor (PMOS) field effect transistor (FET), an N-type MOSFET (NMOS), or any other type of MOS transistor or any type of FET, such as, for example, transistors that may have different threshold voltages, insulator thicknesses, gate configurations, etc., or may be any other suitable transistor type, such as, for example, a junction-field-effect transistor (JFET), bipolar-junction transistor (BJT), metal semiconductor FETs, or other types of three dimensional transistors, MOS or otherwise, known today or not yet developed.

The input transistor 110A may include a first input diffusion 112A, which may include an input terminal 113A (hidden, so not shown in embodiments described herein), which may be, for example, a voltage input (Vin) terminal. The input transistor 110A may further include a first output diffusion 114A that may include a first pathway terminal 115A (hidden, so not shown in embodiments described herein), which may be, for example, a voltage out (Vout) terminal. Power gate 105A may further include an output transistor 130A. The output transistor 130A may include a second input diffusion 132A, which may include a second pathway terminal 133A (hidden, so not shown in embodiments described herein), which may be, for example, a Vin terminal. The output transistor 130A may further include a second output diffusion 134A that may include an output terminal 135A (hidden, so not shown in embodiments described herein), which may be, for example, a Vout terminal. The input transistor 110A and the output transistor 130A, as well as any other transistors that may be included in a power gate in various embodiments described herein, may be the same type of transistor. For example, input transistor 110A and output transistor 130A may be PMOS transistors, or input transistor 110A and output transistor 130A may be NMOS transistors. Further, the input transistor 110A and the output transistor 130A, as well as any other transistors that may be included in a power gate in various embodiments described herein, may each be a different type of transistor and thus may not be the same type of transistor. For example, input transistor 110A may be a PMOS transistor and output transistor 130A may be an NMOS transistor. or input transistor 110A may be an NMOS transistor and output transistor 130A may be a PMOS transistor.

Power gate 105A may further include a gate 122A, where a first portion of the gate 122A may be between the first input diffusion 112A and the first output diffusion 114A, and where a second portion of the gate 122A may be between the second input diffusion 132A and the second output diffusion 134A. Although embodiments herein may be described in terms of a power gate that includes transistors that share a gate, embodiments herein are not limited to a power gate that includes transistors that share a gate. Embodiments herein may include a power gate that includes transistors that may have each have their own gates and thus do not share a gate with another transistor. Power gate 105A may further include a first pathway wire 124A, to couple the input terminal 113A with the second pathway terminal 133A. Power gate 105A may further include a second pathway wire 126A, to couple the first pathway terminal 115A with the output terminal 135A.

IC 100 may further include a first via 120A, to couple the input power wire 102A with the input terminal 113A. A via may be, for example, an opening that enables, for example, a conductive connection between, for example, layers, components, devices, etc. IC 100 may further include an output power wire 104 and a second via 140A, where the second via 140A is to couple the output terminal 135A with the output power wire 104. Although embodiments herein describe vias that are part of an IC, embodiments herein are not limited to vias that are part of an IC. Embodiments herein may include vias that are included as part of a power gate. For example, a via may be part of a diffusion.

IC 100 may further include a power gate 105B that may be similar to power gate 105A. Accordingly, power gate 105B may include an input transistor 110B, which may include a first input diffusion 112B, which may include an input terminal 113B (hidden, so not shown in embodiments described herein), and a first via 120B of IC 100 may couple an input power wire 102B of IC 100 with the input terminal 113B. Power gate 105B may further include a first output diffusion 114B that may include a first pathway terminal 115B (hidden, so not shown in embodiments described herein). Power gate 105B may further include an output transistor 130B, which may include a second input diffusion 132B, which may include a second pathway terminal 133B (hidden, so not shown in embodiments described herein). Power gate 105B may further include a gate 122B, where a first portion of the gate 122B may be between the first input diffusion 112B and the first output diffusion 114B, and where a second portion of the gate 122B may be between the second input diffusion 132B and the second output diffusion 134B. Power gate 105B may further include a first pathway wire 124B, to couple the input terminal 113B with the second pathway terminal 133B, and a second pathway wire 126B, to couple the first pathway terminal 115B with the output terminal 135B. Further, power gate 105B may include a second output diffusion 134B, which may include a second output terminal 135B (hidden, so not shown in embodiments described herein), and a second via 140B of IC 100 may couple the second output terminal 135B with output power wire 104. Accordingly, power gate 105A and power gate 105B may share the output power wire 104.

Although FIG. 1 illustrates power gate 105A and power gate 105B that share output power wire 104, embodiments herein are not limited to power gates that share an output power wire. Embodiments herein may include power gates that share an input power wire. For example, power gate 105A and power gate 105B may share an input power wire, where, for example, an IC 100 may include a power gate 105A that may include an input transistor 110A that may include a first input diffusion 112A that may include a first input terminal 113A, and the IC 100 may further include a first via 120A that may couple the first input terminal 113A with an input power wire. The IC 100 may further include a power gate 105B that may include a first input transistor 110B that may include a first input diffusion 112B that may include a first input terminal 113B, and the IC 100 may further include a second via 140B that may couple the second input terminal 113B with the input power wire.

In an embodiment, one or more power gates may include an input terminal of a source diffusion of a first transistor that may be coupled with an input power wire, and an output terminal of a drain diffusion of a second transistor that may be coupled with an output power wire. For example, input transistor 110A may be a first transistor; first input diffusion 112A may be a first source diffusion; input terminal 113A may be a first input terminal; first output diffusion 114A may be a first drain diffusion; first pathway terminal 115A may be a first output terminal; output transistor 130A may be a second transistor; second input diffusion 132A may be a second source diffusion; second pathway terminal 133A may be a second input terminal; second output diffusion 134A may be a second drain diffusion; output terminal 135A may be a second output terminal; first pathway wire 124A may be a source wire; second pathway wire 126A may be a drain wire; and IC 100 may be described as follows, for example.

IC 100 may include power gate 105A, which may include a first transistor 110A. The first transistor 110A may include a first source diffusion 112A, which may include a first input terminal 113A, which may be, for example, a Vin terminal. The first transistor 110A may further include a first drain diffusion 114A that may include a first output terminal 115A, which may be, for example, a Vout terminal.

Power gate 105A may further include a second transistor 130A, which may include a second source diffusion 132A. The second source diffusion 132A may include a second input terminal 133A, which may be, for example, a Vin terminal. The second transistor 130A may further include a second drain diffusion 134A that may include a second output terminal 135A, which may be, for example, a Vout terminal.

Power gate 105A may further include a gate 122A, where a first portion of the gate 122A may be between the first source diffusion 112A and the first drain diffusion 114A, and where a second portion of the gate 122A may be between the second source diffusion 132A and the second drain diffusion 134A. Power gate 105A may further include a source wire 124A, to couple the first input terminal 113A with the second input terminal 133A. Power gate 105A may further include a drain wire 126A, to couple the first output terminal 115A with the second output terminal 135A.

IC 100 may further include a first via 120A, to couple the input power wire 102A with the first input terminal 113A. IC 100 may further include a second via 140A to couple the second output terminal 135A with the output power wire 104. Further, IC 100 may include a second power gate 105B that may include an input terminal of a source diffusion of a first transistor that may be coupled with an input power wire, and an output terminal of a drain diffusion of a second transistor that may be coupled with an output power wire. For example, first input transistor 110B may be a third transistor; first input diffusion 112B may be a third source diffusion; input terminal 113B may be a third input terminal; first output diffusion 114B may be a third drain diffusion; first pathway terminal 115B may be a third output terminal; output transistor 130B may be a fourth transistor; second input diffusion 132B may be a fourth source diffusion; second pathway terminal 133B may be a fourth input terminal; second output diffusion 134B may be a fourth drain diffusion; output terminal 135B may be a fourth output terminal; gate 122B may be another gate; first pathway wire 124B may be another source wire; second pathway wire 126A may be another drain wire. Further, a second via 140B of IC 100 may couple the fourth output terminal 135B with output power wire 104.

Although this embodiment describes power gate 105A and power gate 105B that share output power wire 104, power gate 105A and power gate 105B may share an input power wire, where, for example, the first via 120A may couple the first input terminal 113A of the first input diffusion 112A with an input power wire, and the third via 120B may couple the third input terminal 113B of the third input diffusion 112B with the input power wire.

In another embodiment, one or more power gates may include an input terminal of a drain diffusion of first transistor that may be coupled with an input power wire, and an output terminal of a source diffusion of a second transistor that may be coupled with an output power wire. For example, input transistor 110A may be a first transistor; first input diffusion 112A may be a first drain diffusion; input terminal 113A may be a first input terminal; first output diffusion 114A may be a first source diffusion; first pathway terminal 115A may be a first output terminal; output transistor 130A may be a second transistor; second input diffusion 132A may be a second drain diffusion; second pathway terminal 133A may be a second input terminal; second output diffusion 134A may be a second source diffusion; output terminal 135A may be a second output terminal; first pathway wire 124A may be a drain wire; second pathway wire 126A may be a source wire; and IC 100 may be described as follows, for example.

IC 100 may include power gate 105A, which may include a first transistor 110A. The first transistor 110A may include a first drain diffusion 112A, which may include a first input terminal 113A, which may be, for example, a Vin terminal. The first transistor 110A may further include a first source diffusion 114A that may include a first output terminal 115A, which may be, for example, a Vout terminal.

Power gate 105A may further include a second transistor 130A. The second transistor 130A may include a second drain diffusion 132A, which may include a second input terminal 133A, which may be, for example, a Vin terminal. The second transistor 130A may further include a second source diffusion 134A, which may include a second output terminal 135A, which may be, for example, a Vout terminal.

Power gate 105A may further include a gate 122A, where a first portion of the gate 122A may be between the first drain diffusion 112A and the first source diffusion 114A, and where a second portion of the gate 122A may be between the second drain diffusion 132A and the second source diffusion 134A. Power gate 105A may further include a drain wire 124A, to couple the first input terminal 113A with the second input terminal 133A. Power gate 105A may further include a source wire 126A, to couple the first output terminal 115A with the second output terminal 135A.

IC 100 may further include a first via 120A, to couple the input power wire 102A with the first input terminal 113A. IC 100 may further include a second via 140A to couple the second output terminal 135A with the output power wire 104.

In an embodiment, when gate 122A is "on" and thus opens a channel between a source diffusion and a drain diffusion, such as, for example, between source diffusion 112A and drain diffusion 114A, for current to flow under a gate, such as, for example, gate 122A, through, for example, a trench contact or other layers of a transistor, such as, for example, transistor 110A, the first input terminal 113A of the first source diffusion 112A may receive, from the input power wire 102, a current through the first via 120A. Further, the second input terminal 133A of the second source diffusion 132A may receive, from the first input terminal 113A of the first source diffusion 112A, a first portion of the current through the source wire 124A, and the second output terminal 135A of the second drain diffusion 134A may receive, from the second input terminal 133A of the second source diffusion 132A, the first portion of the current under the gate 122A. Further, the first output terminal 115A of the first drain diffusion 114A may receive, from the first input terminal 113A of the first source diffusion 112A, a second portion of the current under the gate 122A, and the second output terminal 135A of the second drain diffusion 134A may receive, from the first output terminal 115A of the first drain diffusion 114A, the second portion of the current through the drain wire 126A. Further, the output power wire 104 may receive, from the second output terminal 135A, the first portion of the current and the second portion of the current. Although embodiments may be described in terms of current flow through a power gate that includes a source diffusion that includes an input terminal and a drain diffusion that includes an output terminal, embodiments herein may include current flow through a power gate that includes a drain diffusion that includes an input terminal and a source diffusion that includes an output terminal.

FIG. 2 illustrates another IC that includes power gates in accordance with various embodiments. Although embodiments herein may include an IC 100 that includes a first via 120A to couple the input power wire 102A with the input terminal 113A of input diffusion 112A, and a second via 140A to couple the output terminal 135A of output diffusion 134A with the output power wire 104, embodiments herein are not limited to an IC 100 that includes a first via 120A and a second via 140A. Embodiments herein may include, for example, an IC 200 that includes neither first via 120A nor second via 140A. For example, as illustrated in FIG. 2, in an embodiment, IC 200 may be similar to IC 100. Accordingly, power gate 205A and power gate 205B that may include input transistors 210A and 210B, respectively, which may include first input diffusions 212A and 212B, respectively, which may include input terminals 213A and 213B (hidden, so not shown in embodiments described herein), respectively. Power gates 205A and 205B may further include first output diffusions 214A and 214B that may include first pathway terminals 215A and 215B (hidden, so not shown in embodiments described herein), respectively. Power gates 205A and 205B may further include output transistor 230A and 230B, respectively, which may include second input diffusions 232A and 232B, respectively, which may include second pathway terminals 233A and 233B (hidden, so not shown in embodiments described herein), respectively. Power gates 205A and 205B may further include gates 222A and 222B, respectively, where first portions of the gates 222A and 22B may be between the first input diffusions 212A and 212B, respectively, and the first output diffusions 214A and 214B, respectively, and where second portions of the gates 222A and 222B may be between the second input diffusions 232A and 232B, respectively, and the second output diffusions 234A and 234B, respectively. Power gates 205A and 205B may further include first pathway wires 224A and 224B, to couple the input terminals 213A and 213B, respectively, with the second pathway terminals 233A and 233B, respectively, and second pathway wires 226A and 226B, respectively, to couple first pathway terminals 215A and 215B, respectively, with the output terminals 235A and 235B, respectively. Further, power gates 205A and 205B may include second output diffusions 234A and 234B, respectively, which may include second output terminals 235A (hidden, so not shown in embodiments described herein).

Thus, IC 200 may differ from IC 100 in that IC 200 may include neither first via 120A nor second via 140A. In this embodiment, the first source diffusions 212A and 212B may couple the first input terminals 213A and 213B, respectively, with an input power wire 202A of IC 200, and the second drain diffusions 234A and 234B may couple the second output terminals 235A and 235B, respectively, with an output power wire 204 of IC 200.

As illustrated in FIG. 2, power gate 205A and power gate 205B may share the output power wire 204. Although FIG. 2 illustrates power gate 205A and power gate 205B that share output power wire 204, embodiments herein are not limited to power gates that share an output power wire. Embodiments herein may include power gates that share an input power wire. For example, power gate 205A and power gate 205B may share an input power wire, where, for example, an IC 200 may include a power gate 205A that may include an input transistor 210A that may include a first input diffusion 212A that may include a first input terminal 213A, and the first input diffusion 212A may couple the first input terminal 213A with an input power wire. The IC 200 may further include a power gate 205B that may include a first input transistor 210B that may include a first input diffusion 212B that may include a first input terminal 213B, and the first input diffusion 212B may couple the second input terminal 213B with the input power wire.

In an embodiment, one or more power gates may include an input terminal of a source diffusion of a first transistor that may be coupled with an input power wire, and an output terminal of a drain diffusion of a second transistor that may be coupled with an output power wire. For example, input transistor 210A may be a first transistor; first input diffusion 212A may be a first source diffusion; input terminal 213A may be a first input terminal; first output diffusion 214A may be a first drain diffusion; first pathway terminal 215A may be a first output terminal; output transistor 230A may be a second transistor; second input diffusion 232A may be a second source diffusion; second pathway terminal 233A may be a second input terminal; second output diffusion 234A may be a second drain diffusion; output terminal 235A may be a second output terminal; first pathway wire 224A may be a source wire; second pathway wire 226A may be a drain wire; and IC 200 may be described as follows, for example.

IC 200 may include power gate 205A, which may include a first transistor 210A. The first transistor 210A may include a first source diffusion 212A, which may include a first input terminal 213A, which may be, for example, a Vin terminal. The first source diffusion 212A may couple the input power wire 202A with the first input terminal 213A. The first transistor 210A may further include a first drain diffusion 214A that may include a first output terminal 215A, which may be, for example, a Vout terminal.

Power gate 205A may further include a second transistor 230A, which may include a second source diffusion 232A. The second source diffusion 232A may include a second input terminal 233A, which may be, for example, a Vin terminal. The second transistor 230A may further include a second drain diffusion 234A that may include a second output terminal 235A, which may be, for example, a Vout terminal. The second drain diffusion 234A may couple the output power wire 204 with the second output terminal 235A.

Power gate 205A may further include a gate 222A, where a first portion of the gate 222A may be between the first source diffusion 212A and the first drain diffusion 214A, and where a second portion of the gate 222A may be between the second source diffusion 232A and the second drain diffusion 234A. Power gate 205A may further include a source wire 224A, to couple the first input terminal 213A with the second input terminal 233A. Power gate 205A may further include a drain wire 226A, to couple the first output terminal 215A with the second output terminal 135A.

Further, IC 200 may include a second power gate 205B that may include an input terminal of a source diffusion of a first transistor that may be coupled with an input power wire, and an output terminal of a drain diffusion of a second transistor that may be coupled with an output power wire. For example, first input transistor 210B may be a third transistor; first input diffusion 212B may be a third source diffusion; input terminal 213B may be a third input terminal; first output diffusion 214B may be a third drain diffusion; first pathway terminal 215B may be a third output terminal; output transistor 230B may be a fourth transistor; second input diffusion 232B may be a fourth source diffusion; second pathway terminal 233B may be a fourth input terminal; second output diffusion 234B may be a fourth drain diffusion; output terminal 235B may be a fourth output terminal; gate 222B may be another gate; first pathway wire 224B may be another source wire; second pathway wire 226A may be another drain wire. Further, fourth drain diffusion 234B may couple the fourth output terminal 235B with output power wire 204.

Although this embodiment describes power gate 205A and power gate 205B that share output power wire 204, power gate 205A and power gate 205B may share an input power wire, where, for example, the first source diffusion 212A may couple the first input terminal 213A with an input power wire, and the third source diffusion 212B may couple the third input terminal 213B with the input power wire.

In another embodiment, one or more power gates may include an input terminal of a drain diffusion of first transistor that may be coupled with an input power wire, and an output terminal of a source diffusion of a second transistor that may be coupled with an output power wire. For example, input transistor 210A may be a first transistor; first input diffusion 212A may be a first drain diffusion; input terminal 213A may be a first input terminal; first output diffusion 214A may be a first source diffusion; first pathway terminal 215A may be a first output terminal; output transistor 230A may be a second transistor; second input diffusion 232A may be a second drain diffusion; second pathway terminal 233A may be a second input terminal; second output diffusion 234A may be a second source diffusion; output terminal 235A may be a second output terminal; first pathway wire 224A may be a drain wire; second pathway wire 226A may be a source wire; and IC 200 may be described as follows, for example.

IC 200 may include power gate 205A, which may include a first transistor 210A. The first transistor 210A may include a first drain diffusion 212A, which may include a first input terminal 213A, which may be, for example, a Vin terminal. The first drain diffusion 212A may couple the input power wire 202A with the first input terminal 213A. The first transistor 110A may further include a first source diffusion 214A that may include a first output terminal 215A, which may be, for example, a Vout terminal.

Power gate 105A may further include a second transistor 230A. The second transistor 230A may include a second drain diffusion 232A, which may include a second input terminal 233A, which may be, for example, a Vin terminal. The second transistor 230A may further include a second source diffusion 234A, which may include a second output terminal 235A, which may be, for example, a Vout terminal. The second source diffusion 234A may couple the output power wire 204 with the second output terminal 235A.

Power gate 205A may further include a gate 222A, where a first portion of the gate 222A may be between the first drain diffusion 212A and the first source diffusion 214A, and where a second portion of the gate 222A may be between the second drain diffusion 232A and the second source diffusion 234A. Power gate 205A may further include a drain wire 224A, to couple the first input terminal 213A with the second input terminal 233A. Power gate 205A may further include a source wire 226A, to couple the first output terminal 215A with the second output terminal 235A.

In an embodiment, when gate 222A is "on," the first input terminal 213A of the first source diffusion 212A may receive, from the input power wire 202A, a current through the first source diffusion 212A. Further, the second input terminal 233A of the second source diffusion 232A may receive, from the first input terminal 213A of the first source diffusion 212A, a first portion of the current through the source wire 224A, and the second output terminal 235A of the second drain diffusion 234A may receive, from the second input terminal 233A of the second source diffusion 232A, the first portion of the current under the gate 222A. Further, the first output terminal 215A of the first drain diffusion 214A may receive, from the first input terminal 213A of the first source diffusion 212A, a second portion of the current under the gate 222A, and the second output terminal 235A of the second drain diffusion 234A may receive, from the first output terminal 215A of the first drain diffusion 214A, the second portion of the current through the drain wire 226A. Further, the output power wire 204 may receive, from the second output terminal 235A of the second drain diffusion 234A, the first portion of the current and the second portion of the current through the second drain diffusion 234A. Although embodiments may be described in terms of current flow through a power gate that includes a source diffusion that includes an input terminal and a drain diffusion that includes an output terminal, embodiments herein may include current flow through a power gate that includes a drain diffusion that includes an input terminal and a source diffusion that includes an output terminal.

Embodiments may include one or more input power wires and one or more output power wires that may be on a lower plane, and one or more source wires and one or more drain wires that may be on an upper plane. However, embodiments herein are not limited to one or more input power wires and one or more output power wires that are on a lower plane, and one or more source wires and one or more drain wires that are on an upper plane. Embodiments may include one or more input power wires and one or more output power wires on one plane, and one or more source wires and one or more drain wires on a different plane than one or more input and one or more output power wires. Further, embodiments may include an input power wire that may be coupled with global power, and an output power wire that may be coupled with local power.

For purposes of illustration and ease of explanation, embodiments herein have been described in terms of power gates that include two transistors. However, embodiments herein are not limited to power gates that include two transistors. Embodiments herein may include a power gate that includes any number of transistors. Further, embodiments herein may include a power gate that includes transistors coupled or connected in series or transistors coupled or connected in parallel.

Further, although embodiments herein may include power gates that include pathway wires, source wires, or drain wires, embodiments herein may include power gates that do not include pathways wires, source wires or drain wires. In embodiments that do not include pathway wires, source wires or drain wires, a current path may include a source diffusion or a drain diffusion, in that current may flow through a source diffusion or a drain diffusion when a power gate does not include a pathway wire, a source wire, or a drain wire. Further, current may flow through a source diffusion or a drain diffusion even if the power gate includes a source wire, or a drain wire.

Further, for purposes of illustration and ease of explanation, embodiments herein have been described in terms of ICs that include two power gates. However, embodiments herein are not limited to ICs that include two power gates. Embodiments herein may include an IC that includes any number of power gates.

Embodiments herein may include a lower plane, which may also be referred to as a lower level, where, regardless of whether an IC or power gate is oriented in a vertical, a horizontal, or an angled position, an input power wire and an output power wire may be on the lower plane. Embodiments herein may further include an upper plane, which may also be referred to as an upper level, where, regardless of whether an IC or power gate is oriented in a vertical, a horizontal, or an angled position, a source diffusion, a drain diffusion, a source wire, or a drain wire may be on the upper plane.

Embodiments herein may further include an input power wire coupled with global power, to enable power to be provided to an IC, and an output power wire coupled with local power, to enable power to be provided to cores of an IC.

Embodiments may further include one or more power gates vertically coupled with one or more other power gates, for example, on top of one or more other power gates or below one or more other power gates. Embodiments may further include one or more power gates coupled beside one or more other power gates.

Figure 1A:
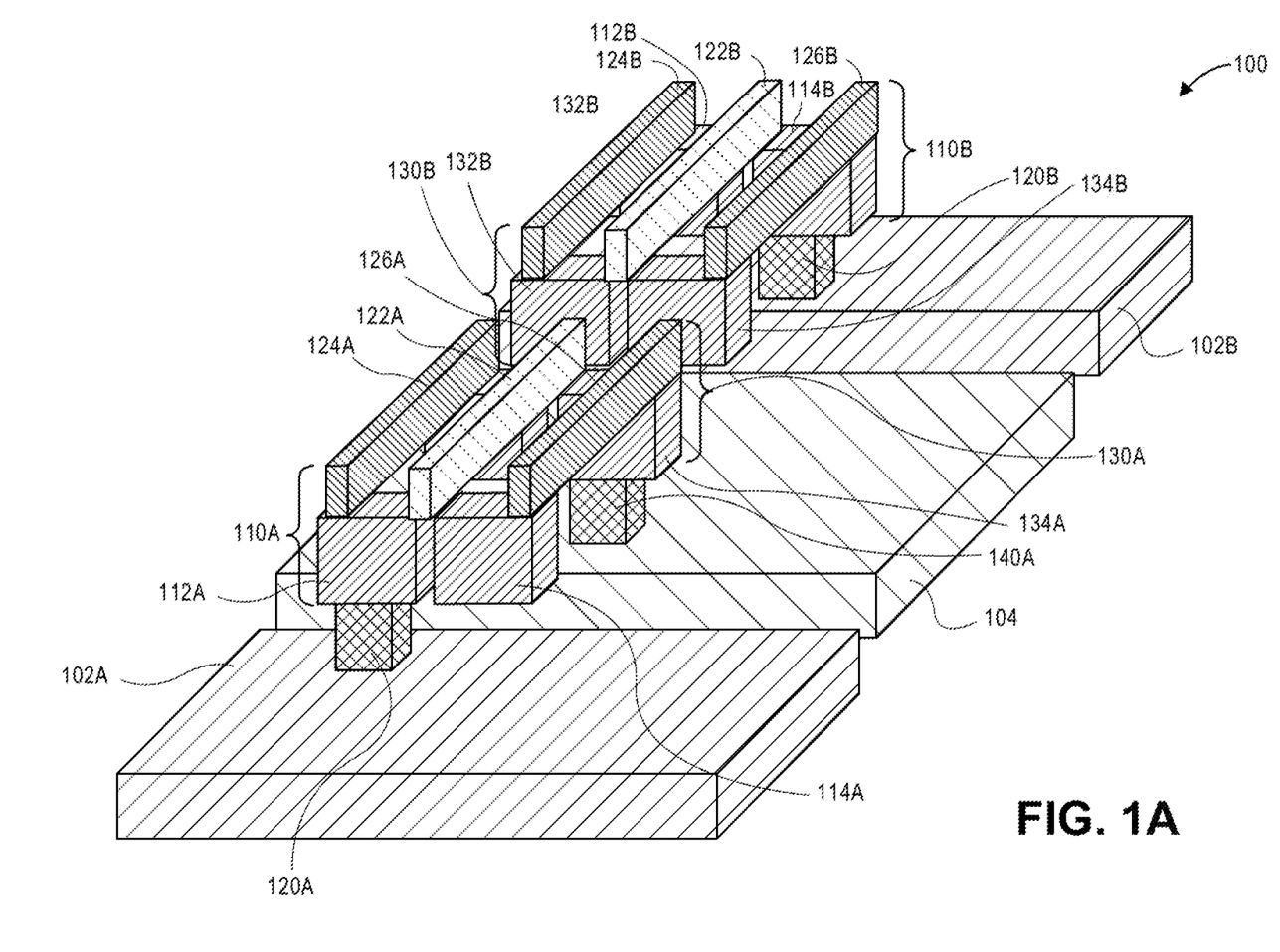
FIG. 1A illustrates a three-dimensional view of the components of the IC.
Figure 1B:
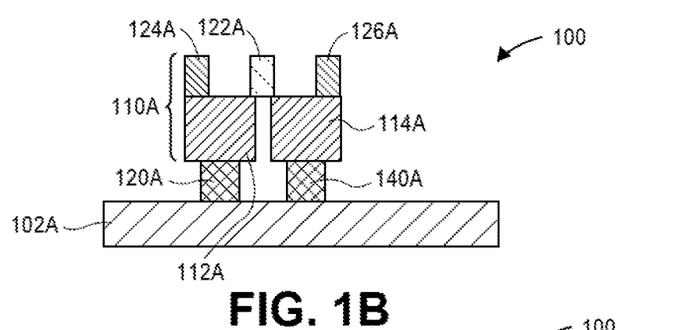
FIG. 1B illustrates a side view of the components of the IC of FIG. 1A.
Figure 1C:
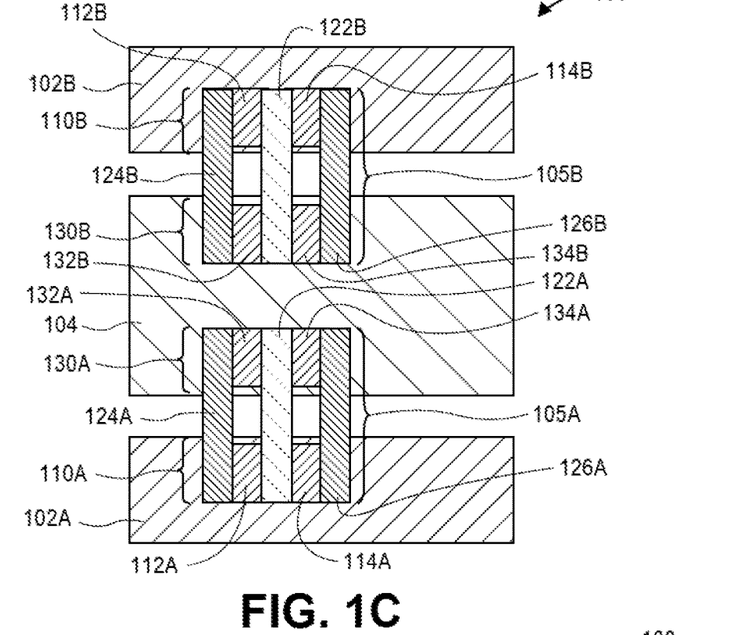
FIG. 1C illustrates a top view of the components of the IC of FIG. 1A.
Figure 1D:
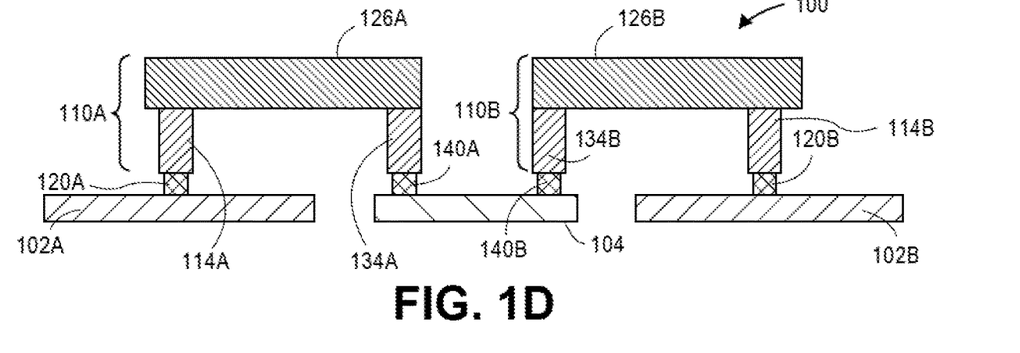
FIG. 1D illustrates a front view of the components of the IC of FIG. 1A.
Figure 2A:
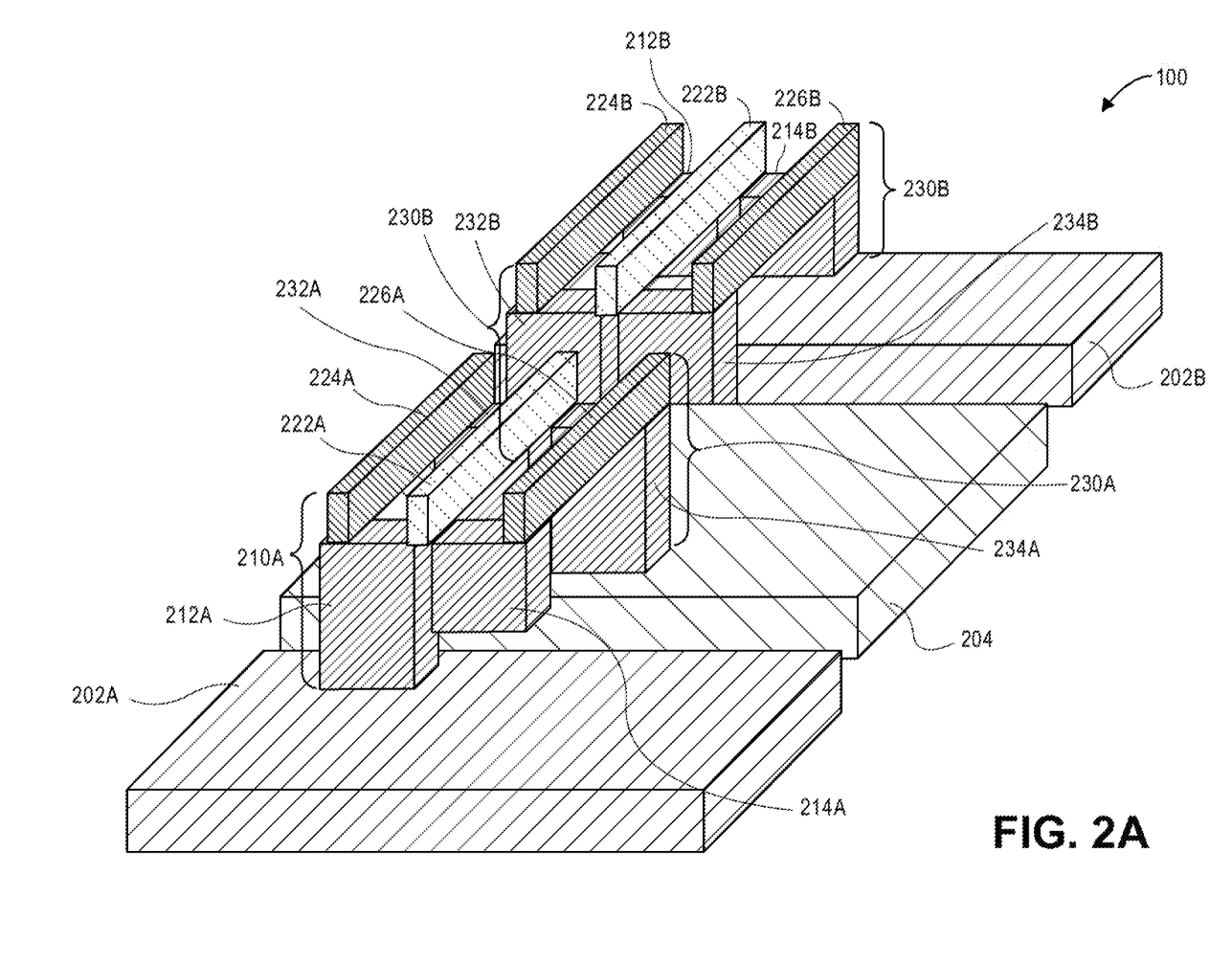
FIG. 2A illustrates a three-dimensional view of the components of the IC.
Figure 2B:
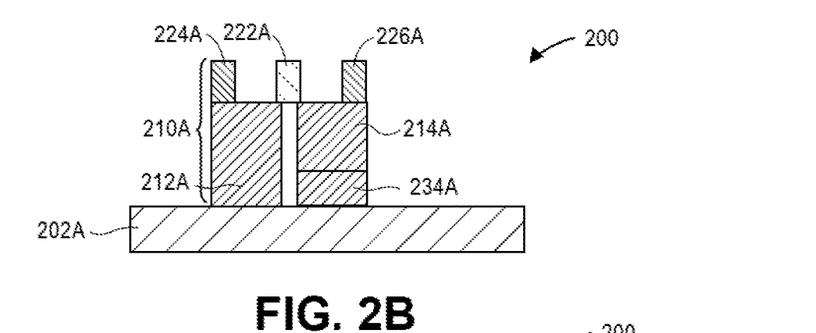
FIG. 2B illustrates a side view of the components of the IC of FIG. 2A.
Figure 2C:
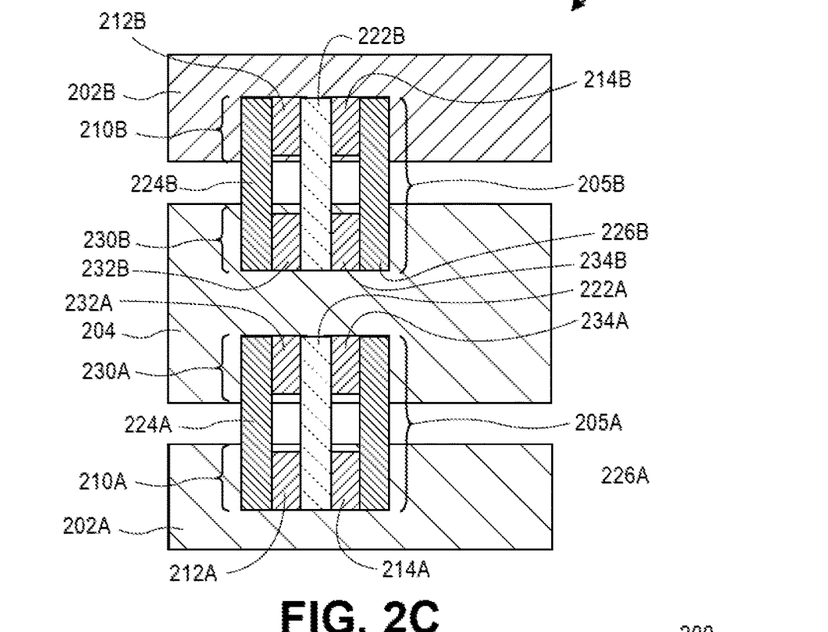
FIG. 2C illustrates a top view of the components of the IC of FIG. 2A.
Figure 2D:
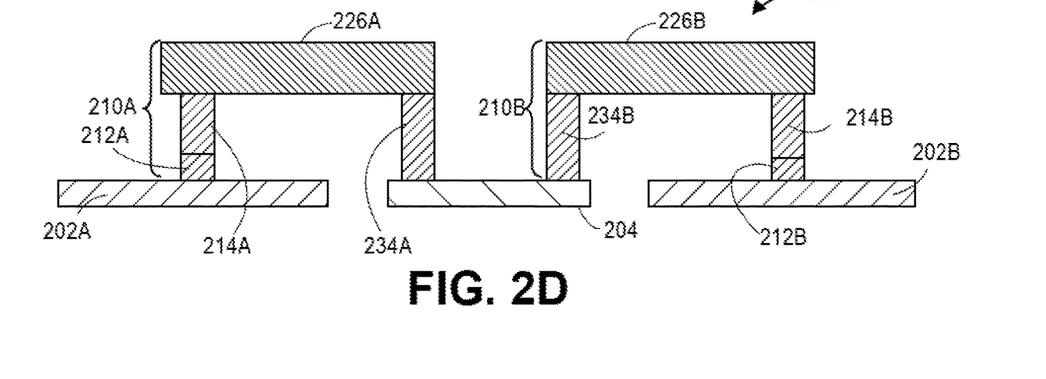
FIG. 2D illustrates a front view of the components of the IC of FIG. 2A.
Figure 3:
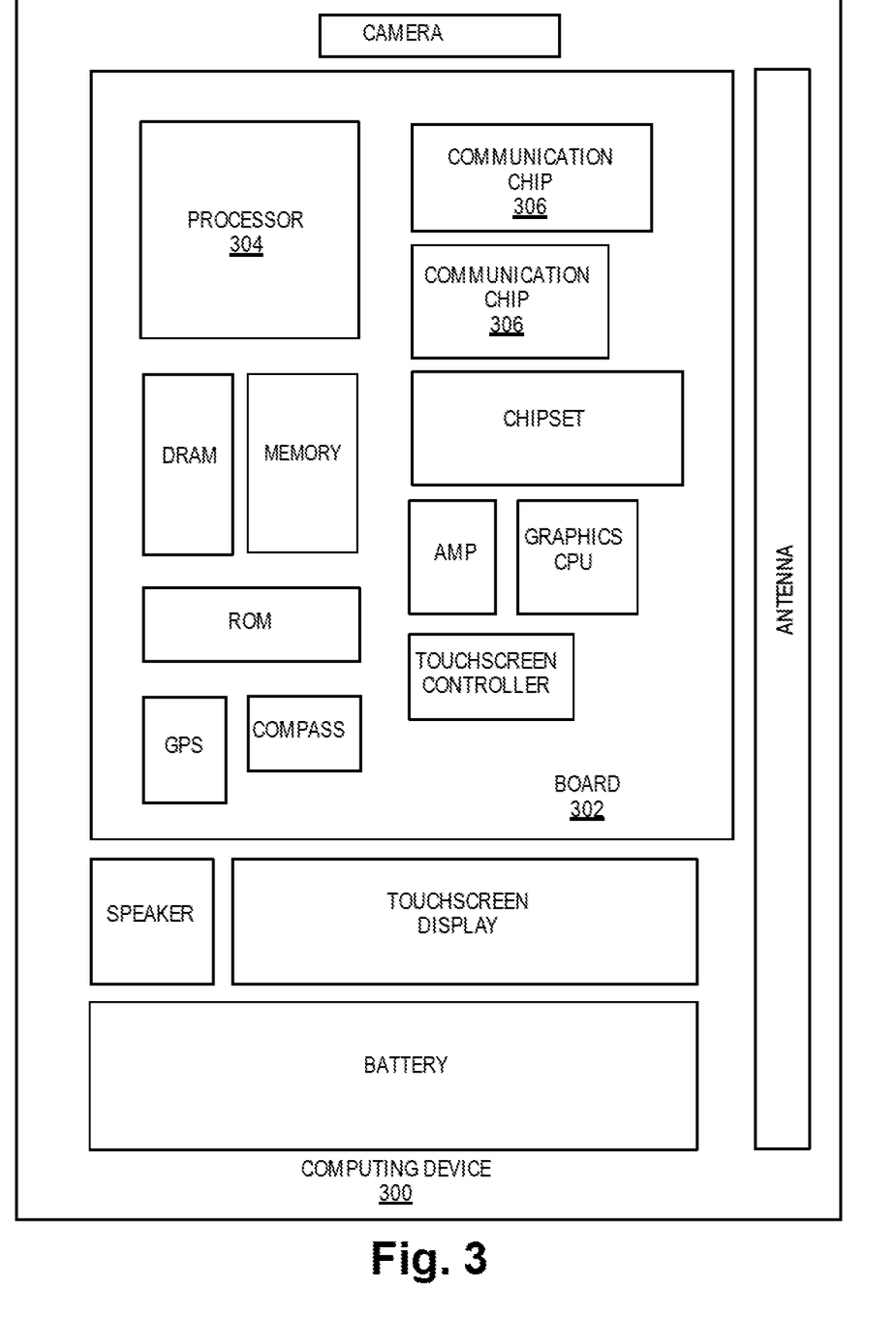
FIG. 3 illustrates an example electronic device in accordance with various embodiments.

FIG. 3 illustrates an example electronic device, in accordance with various embodiments. The electronic device 300 houses a board 302. The board 302 may include a number of components, including but not limited to a processor 304, and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, electronic device 300 may include other components that may or may not be physically and electrically coupled to the board 302. These other components include, but are not limited to, memory (generally, as described in more detail below), volatile memory (e.g., DRAM) non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the electronic device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The electronic device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the electronic device 300 may include one or more single-core or multi-core processors. The processor(s) may include any combination of general-purpose processors and dedicated processors. In some implementations of embodiments of the present disclosure, the processor 304 may include one or more devices, such as, for example, power gate 105A, power gate 105B, power gate 205A, power gate 205B, input power wire 102A, input power wire 102B, input power wire 202A, input power wire 202B, output power wire 104, output power wire 204, first via 120A, first via 120B, second via 140A, or second via 140B. The term "processor" may refer to any device or portion of a device that processes electronic data from registers and/or memory to transform that electronic data into other electronic data that may be stored in registers and/or memory, or that executes instructions that may be stored in registers and/or memory, where "memory" may refer to one or more transient and/or static memory units configured to store instructions or electronic data. The processors may be coupled with or may include memory/storage and may be configured to execute instructions stored in the memory/storage to enable various applications or operating systems to run on the electronic device 300.

The communication chip 306 also includes an integrated circuit die packaged within the communication chip 306. In accordance with another implementation of embodiments of the present disclosure, the integrated circuit die of the communication chip may include one or more devices, such as power gate 105A, power gate 105B, power gate 205A, or power gate 205B. In further implementations, another component housed within the electronic device 300 may include an integrated circuit die that includes one or more devices, such as power gate 105A, power gate 105B, power gate 205A, or power gate 205B.

In various embodiments, the electronic device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the electronic device 300 may be any other electronic device that processes data.

Thus, embodiments herein include power gating for multiple backside voltage planes. Embodiments may also include fabricating power gating for multiple backside voltage planes in accordance with various embodiments, including, but not limited to, fabricating power gates in accordance with various embodiments, and ICs that include power gates in accordance with various embodiments.

Some non-limiting examples are provided below.

EXAMPLES

Example 1 may include an integrated circuit (IC), comprising: an input power wire; a power gate, comprising: a first transistor comprising a first source diffusion that includes a first input terminal and a first drain diffusion that includes a first output terminal; a second transistor comprising a second source diffusion that includes a second input terminal and a second drain diffusion that includes a second output terminal; a gate, wherein a first portion of the gate is between the first source diffusion and the first drain diffusion, and wherein a second portion of the gate is between the second source diffusion and the second drain diffusion; a source wire to couple the first input terminal with the second input terminal; and a drain wire to couple the first output terminal with the second output terminal; a first via to couple the input power wire with the first input terminal; an output power wire; and a second via to couple the second output terminal with the output power wire.

Example 2 may include the IC of Example 1 or some other example herein, wherein when the gate is on, the first input terminal of the first source diffusion is to receive, from the input power wire, a current through the first via, wherein the second input terminal of the second source diffusion is to receive, from the first input terminal of the first source diffusion, a first portion of the current through the source wire, wherein the second output terminal of the second drain diffusion is to receive, from the second input terminal of the second source diffusion, the first portion of the current under the gate, wherein the first output terminal of the first drain diffusion is to receive, from the first input terminal of the first source diffusion, a second portion of the current under the gate, wherein the second output terminal of the second drain diffusion is to receive, from the first output terminal of the first drain diffusion, the second portion of the current through the drain wire, and wherein the output power wire is to receive, from the second output terminal of the second drain diffusion, the first portion of the current and the second portion of the current through the second via.

Example 3 may include the IC of Example 1 or 2 or some other example herein, further comprising: a lower plane, wherein the input power wire and the output power wire are on the lower plane; and an upper plane, wherein the source wire and the drain wire are on the upper plane.

Example 4 may include the IC of Example 1 or 2 or some other example herein, wherein the input power wire is coupled with a global power, and wherein the output power wire is coupled with a local power.

Example 5 may include the IC of Example 1 or 2 or some other example herein, wherein the first transistor and the second transistor are P-type metal oxide semiconductor (PMOS) transistors or N-type metal oxide semiconductor (NMOS) transistors.

Example 6 may include the IC of Example 1 or 2 or some other example herein, wherein the first transistor is a PMOS transistor or an NMOS transistor, and wherein the second transistor is a PMOS transistor or an NMOS transistor.

Example 7 may include the IC of Example 1 or 2 or some other example herein, wherein the power gate is a first power gate, and wherein the IC further comprises a second power gate vertically coupled with the first power gate.

Example 8 may include the IC of Example 1 or 2 some other example herein, wherein the power gate is a first power gate, and wherein the IC further comprises: another input power wire; a second power gate, comprising: a third transistor comprising a third source diffusion that includes a third input terminal and a third drain diffusion that includes a third output terminal; a fourth transistor comprising a fourth source diffusion that includes a fourth input terminal and a fourth drain diffusion that includes a fourth output terminal; another gate, wherein a first portion of other gate is between the third source diffusion and the third drain diffusion, and wherein a second portion of the other gate is between the fourth source diffusion and the fourth drain diffusion; and another source wire to couple the third input terminal with the fourth input terminal; another drain wire to couple the third output terminal with the fourth output terminal; a third via to couple the other input power wire with the third input terminal; and a fourth via to couple the fourth output terminal with the output power wire.

Example 9 may include an integrated circuit (IC), comprising: an input power wire; a power gate, comprising: a first transistor comprising a first source diffusion that includes a first input terminal, wherein the first source diffusion is to couple the input power wire with the first input terminal and a first drain diffusion that includes a first output terminal; a second transistor comprising a second source diffusion that includes a second input terminal and a second drain diffusion that includes a second output terminal; a gate, wherein a first portion of the gate is between the first source diffusion and the first drain diffusion, and wherein a second portion of the gate is between the second source diffusion and the second drain diffusion; a source wire, to couple the first input terminal with the second input terminal; and a drain wire, to couple the first output terminal with the second output terminal; and an output power wire, wherein the second drain diffusion is to couple the second output terminal with the output power wire.

Example 10 may include the IC of Example 9 or some other example herein, wherein when the gate is on, the first input terminal of the first source diffusion is to receive, from the input power wire, a current through the first source diffusion, wherein the second input terminal of the second source diffusion is to receive, from the first input terminal of the first source diffusion, a first portion of the current through the source wire, wherein the second output terminal of the second drain diffusion is to receive, from the second input terminal of the second source diffusion, the first portion of the current under the gate, wherein the first output terminal of the first drain diffusion is to receive, from the first input terminal of the first source diffusion, a second portion of the current under the gate, wherein the second output terminal of the second drain diffusion is to receive, from the first output terminal of the first drain diffusion, the second portion of the current through the drain wire, and wherein the output power wire is to receive, from the second output terminal of the second drain diffusion, the first portion of the current and the second portion of the current through the second drain diffusion.

Example 11 may include the IC of Example 9 or 10 or some other example herein, further comprising: a lower plane, wherein the input power wire and the output power wire are on the lower plane; and an upper plane, wherein the source wire and the drain wire are on the upper plane.

Example 12 may include the IC of Example 9 or 10 or some other example herein, wherein the power gate is a first power gate, and wherein the IC further comprises a second power gate vertically coupled on top of the first power gate.

Example 13 may include the IC of Example 9 or some other example herein, wherein the power gate is a first power gate, and wherein the IC further comprises: another input power wire; a second power gate, comprising: a third transistor comprising a third source diffusion that includes a third input terminal, wherein the third source diffusion is to couple the other input power wire with the third input terminal and a third drain diffusion that includes a third output terminal; a fourth transistor comprising a fourth source diffusion that includes a fourth input terminal and a fourth drain diffusion that includes a fourth output terminal, wherein the fourth drain diffusion is to couple the output terminal with the output power wire; another gate, wherein a first portion of the other gate is between the third source diffusion and the third drain diffusion, and wherein a second portion of the other gate is between the fourth source diffusion and the fourth drain diffusion; another source wire, to couple the third input terminal with the fourth input terminal; another drain wire, to couple the third output terminal with the fourth output terminal.

Example 14 may include a board, comprising: a memory, to store instructions; and a processor coupled with the memory, to execute the instructions, comprising: an input power wire; a power gate, comprising: an input transistor comprising a first input diffusion that includes an input terminal and a first output diffusion that includes a first pathway terminal; an output transistor comprising a second input diffusion that includes a second pathway terminal and a second output diffusion that includes an output terminal; a gate, wherein a first portion of the gate is between the first input diffusion and the first output diffusion, and wherein a second portion of the gate is between the second input diffusion and the second output diffusion; a first pathway wire, to couple the input terminal with the second pathway terminal; and a second pathway wire, to couple the first pathway terminal with the output terminal; a first via, to couple the input power wire with the input terminal; an output power wire; and a second via, to couple the output terminal with the output power wire.

Example 15 may include the board of Example 14 or some other example herein, wherein the first input diffusion is a first source diffusion, the first output diffusion is a first drain diffusion, the second input diffusion is a second source diffusion, and the second output diffusion is a second drain diffusion.

Example 16 may include the board of Example 15 or some other example herein, wherein the power gate is a first power gate, the input transistor is a first transistor, and the output transistor is a second transistor, and wherein the processor further comprises: another input power wire; a second power gate, comprising: a third transistor comprising a third source diffusion that includes a third input terminal, and a third drain diffusion that includes a third output terminal; a fourth transistor comprising a fourth source diffusion that includes a fourth input terminal, and a fourth drain diffusion that includes a fourth output terminal; another gate, wherein a first portion of other gate is between the third source diffusion and the third drain diffusion, and wherein a second portion of the other gate is between the fourth source diffusion and the fourth drain diffusion; and another source wire, to couple the third input terminal with the fourth input terminal; and another drain wire, to couple the third output terminal with the fourth output terminal; a third via, to couple the other input power wire with the third input terminal; and a fourth via, to couple the fourth output terminal with the output power wire.

Example 17 may include the board of Example 15 or some other example herein, wherein the power gate is a first power gate, the input transistor is a first transistor, and the output transistor is a second transistor, and wherein the processor further comprises: another input power wire; a second power gate, comprising: a third transistor comprising a third source diffusion that includes a third input terminal, and a third drain diffusion that includes a third output terminal; a fourth transistor comprising a fourth source diffusion that includes a fourth input terminal, and a fourth drain diffusion that includes a fourth output terminal; another gate, wherein a first portion of the other gate is between the third source diffusion and the third drain diffusion, and wherein a second portion of the other gate is between the fourth source diffusion and the fourth drain diffusion; another source wire, to couple the third input terminal with the fourth input terminal; and another drain wire, to couple the third output terminal with the fourth output terminal; another output power wire, wherein the fourth drain diffusion is to couple the output terminal with the other output power wire; a third via, to couple the input power wire with the third input terminal; and a fourth via, to couple the fourth output terminal with the other output power wire.

Example 18 may include the board of Example 14 or some other example herein, wherein the first input diffusion is a first drain diffusion, the first output diffusion is a first source diffusion, the second input diffusion is a second drain diffusion, and the second output diffusion is a second source diffusion.

Example 19 may include the board of Example 18 or some other example herein, wherein the power gate is a first power gate, the input transistor is a first transistor, and the output transistor is a second transistor, and wherein the processor further comprises: another input power wire; a second power gate, comprising: a third transistor comprising a third drain diffusion that includes a third input terminal, and a third source diffusion that includes a third output terminal; a fourth transistor comprising a fourth drain diffusion that includes a fourth input terminal, and a fourth source diffusion that includes a fourth output terminal; another gate, wherein a first portion of other gate is between the third source diffusion and the third drain diffusion, and wherein a second portion of the other gate is between the fourth source diffusion and the fourth drain diffusion; and another drain wire, to couple the third input terminal with the fourth input terminal; another source wire, to couple the third output terminal with the fourth output terminal; a third via, to couple the other input power wire with the third input terminal; and a fourth via, to couple the fourth output terminal with the output power wire.

Example 20 may include the board of Example 18, wherein the power gate is a first power gate, the input transistor is a first transistor, and the output transistor is a second transistor, and wherein the processor further comprises: another input power wire; a second power gate, comprising: a third transistor, comprising a third drain diffusion that includes a third input terminal, and a third source diffusion that includes a third output terminal; a fourth transistor, comprising a fourth drain diffusion that includes a fourth input terminal, and a fourth source diffusion that includes a fourth output terminal; another gate, wherein a first portion of the other gate is between the third source diffusion and the third drain diffusion, and wherein a second portion of the other gate is between the fourth source diffusion and the fourth drain diffusion; another drain wire, to couple the third input terminal with the fourth input terminal; and another source wire, to couple the third output terminal with the fourth output terminal; another output power wire, wherein the fourth source diffusion is to couple the output terminal with the other output power wire; a third via, to couple the input power wire with the third input terminal; and a fourth via, to couple the fourth output terminal with the other output power wire.

Example 21 may include a semiconductor device, comprising: a first transistor comprising a first source diffusion that includes a first input terminal, and a first drain diffusion that includes a first output terminal; a second transistor comprising a second source diffusion that includes a second input terminal, and a second drain diffusion that includes a second output terminal; a gate, wherein a first portion of the gate is between the first source diffusion and the first drain diffusion, and wherein a second portion of the gate is between the second source diffusion and the second drain diffusion; a source wire, to couple the first input terminal with the second input terminal; and a drain wire, to couple the first output terminal with the second output terminal.

Example 22 may include the semiconductor device of Example 21 or some other example herein, wherein the first transistor is a P-type metal oxide semiconductor (PMOS) transistors or an N-type metal oxide semiconductor (NMOS) transistor, and wherein the second transistor is a PMOS transistor or an NMOS transistor.

Example 23 may include the semiconductor device of Example 21 or 22 or some other example herein, wherein a first via couples the first input terminal with an input power wire, and wherein a second via couples the second output terminal with an output power wire.

Example 24 may include the semiconductor device of Example 23 or some other example herein, further comprising: a lower plane, wherein the input power wire and the output power wire are on the lower plane; and an upper plane, wherein the source wire and the drain wire are on the upper plane.

Example 25 may include the semiconductor device of Example 23 or some other example herein, wherein when the gate is on, the first source diffusion is to receive a current from the input power wire through the first via, wherein the second source diffusion is to receive from the first source diffusion a first portion of the current through the source wire, wherein the second drain diffusion is to receive from the second source diffusion the first portion of the current under the gate, wherein the first drain diffusion is to receive from the first source diffusion a second portion of the current under the gate, wherein the second drain diffusion is to receive from the first drain diffusion region the second portion of the current through the drain wire, and wherein the output power wire is to receive from the second drain diffusion the first portion of the current and the second portion of the current.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC), comprising:
an input power wire;
a power gate, comprising:
 a first transistor comprising a first source diffusion that includes a first input terminal and a first drain diffusion that includes a first output terminal;
 a second transistor comprising a second source diffusion that includes a second input terminal and a second drain diffusion that includes a second output terminal;
 a gate, wherein a first portion of the gate is between the first source diffusion and the first drain diffusion, wherein a second portion of the gate is between the second source diffusion and the second drain diffusion, wherein the first portion of the gate has a longest dimension along a direction, and the second portion of the gate has a longest dimension along the direction, and wherein the first portion of the gate and the second portion of the gate are in a same first plane;
 a source wire to couple the first input terminal with the second input terminal, wherein the source wire has a longest dimension along the direction; and
 a drain wire to couple the first output terminal with the second output terminal, wherein the drain wire has a longest dimension along the direction;

a first via to couple the input power wire with the first input terminal;
an output power wire, wherein the output power wire and the input power wire are in a same second plane, the second plane parallel with the first plane, and wherein the output power wire is laterally spaced apart from the input power wire in the second plane, and wherein the output power wire has an uppermost surface at a same level as an uppermost surface of the input power wire; and
a second via to couple the second output terminal with the output power wire.

2. The IC of claim 1, wherein when the gate is on, the first input terminal of the first source diffusion is to receive, from the input power wire, a current through the first via, wherein the second input terminal of the second source diffusion is to receive, from the first input terminal of the first source diffusion, a first portion of the current through the source wire, wherein the second output terminal of the second drain diffusion is to receive, from the second input terminal of the second source diffusion, the first portion of the current under the gate, wherein the first output terminal of the first drain diffusion is to receive, from the first input terminal of the first source diffusion, a second portion of the current under the gate, wherein the second output terminal of the second drain diffusion is to receive, from the first output terminal of the first drain diffusion, the second portion of the current through the drain wire, and wherein the output power wire is to receive, from the second output terminal of the second drain diffusion, the first portion of the current and the second portion of the current through the second via.

3. The IC of claim 1, further comprising:
a lower plane, wherein the input power wire and the output power wire are on the lower plane; and
an upper plane, wherein the source wire and the drain wire are on the upper plane.

4. The IC of claim 1, wherein the input power wire is coupled with a global power, and wherein the output power wire is coupled with a local power.

5. The IC of claim 1, wherein the first transistor and the second transistor are P-type metal oxide semiconductor (PMOS) transistors or N-type metal oxide semiconductor (NMOS) transistors.

6. The IC of claim 1, wherein the first transistor is a PMOS transistor or an NMOS transistor, and wherein the second transistor is a PMOS transistor or an NMOS transistor.

7. The IC of claim 1, wherein the power gate is a first power gate, and wherein the IC further comprises a second power gate vertically coupled with the first power gate.

8. The IC of claim 1, wherein the power gate is a first power gate, and wherein the IC further comprises:
another input power wire;
a second power gate, comprising:
a third transistor comprising a third source diffusion that includes a third input terminal and a third drain diffusion that includes a third output terminal;
a fourth transistor comprising a fourth source diffusion that includes a fourth input terminal and a fourth drain diffusion that includes a fourth output terminal;
another gate, wherein a first portion of other gate is between the third source diffusion and the third drain diffusion, and wherein a second portion of the other gate is between the fourth source diffusion and the fourth drain diffusion; and
another source wire to couple the third input terminal with the fourth input terminal;
another drain wire to couple the third output terminal with the fourth output terminal;
a third via to couple the other input power wire with the third input terminal; and
a fourth via to couple the fourth output terminal with the output power wire.

9. A board, comprising:
a memory, to store instructions; and
a processor coupled with the memory, to execute the instructions, comprising:
an input power wire;
a power gate, comprising:
an input transistor comprising a first input diffusion that includes an input terminal and a first output diffusion that includes a first pathway terminal;
an output transistor comprising a second input diffusion that includes a second pathway terminal and a second output diffusion that includes an output terminal;
a gate, wherein a first portion of the gate is between the first input diffusion and the first output diffusion, wherein a second portion of the gate is between the second input diffusion and the second output diffusion, wherein the first portion of the gate has a longest dimension along a direction, and the second portion of the gate has a longest dimension along the direction, and wherein the first portion of the gate and the second portion of the gate are in a same first plane;
a first pathway wire, to couple the input terminal with the second pathway terminal, wherein the first pathway wire has a longest dimension along the direction; and
a second pathway wire, to couple the first pathway terminal with the output terminal, wherein the second pathway wire has a longest dimension along the direction;
a first via, to couple the input power wire with the input terminal;
an output power wire, wherein the output power wire and the input power wire are in a same second plane, the second plane parallel with the first plane, and wherein the output power wire is laterally spaced apart from the input power wire in the second plane, and wherein the output power wire has an uppermost surface at a same level as an uppermost surface of the input power wire; and
a second via, to couple the output terminal with the output power wire.

10. The board of claim 9, wherein the first input diffusion is a first source diffusion, the first output diffusion is a first drain diffusion, the second input diffusion is a second source diffusion, and the second output diffusion is a second drain diffusion.

11. The board of claim 10, wherein the power gate is a first power gate, the input transistor is a first transistor, and the output transistor is a second transistor, and wherein the processor further comprises:
another input power wire;
a second power gate, comprising:
a third transistor comprising a third source diffusion that includes a third input terminal, and a third drain diffusion that includes a third output terminal;
a fourth transistor comprising a fourth source diffusion that includes a fourth input terminal, and a fourth drain diffusion that includes a fourth output terminal;

another gate, wherein a first portion of other gate is between the third source diffusion and the third drain diffusion, and wherein a second portion of the other gate is between the fourth source diffusion and the fourth drain diffusion; and
another source wire, to couple the third input terminal with the fourth input terminal; and
another drain wire, to couple the third output terminal with the fourth output terminal;
a third via, to couple the other input power wire with the third input terminal; and
a fourth via, to couple the fourth output terminal with the output power wire.

12. The board of claim 10, wherein the power gate is a first power gate, the input transistor is a first transistor, and the output transistor is a second transistor, and wherein the processor further comprises:
  another input power wire;
  a second power gate, comprising:
    a third transistor comprising a third source diffusion that includes a third input terminal, and a third drain diffusion that includes a third output terminal;
    a fourth transistor comprising a fourth source diffusion that includes a fourth input terminal, and a fourth drain diffusion that includes a fourth output terminal;
    another gate, wherein a first portion of the other gate is between the third source diffusion and the third drain diffusion, and wherein a second portion of the other gate is between the fourth source diffusion and the fourth drain diffusion;
  another source wire, to couple the third input terminal with the fourth input terminal; and
  another drain wire, to couple the third output terminal with the fourth output terminal;
  another output power wire, wherein the fourth drain diffusion is to couple the output terminal with the other output power wire;
  a third via, to couple the input power wire with the third input terminal; and
  a fourth via, to couple the fourth output terminal with the other output power wire.

13. The board of claim 9, wherein the first input diffusion is a first drain diffusion, the first output diffusion is a first source diffusion, the second input diffusion is a second drain diffusion, and the second output diffusion is a second source diffusion.

14. The board of claim 13, wherein the power gate is a first power gate, the input transistor is a first transistor, and the output transistor is a second transistor, and wherein the processor further comprises:
  another input power wire;
  a second power gate, comprising:
    a third transistor comprising a third drain diffusion that includes a third input terminal, and a third source diffusion that includes a third output terminal;
    a fourth transistor comprising a fourth drain diffusion that includes a fourth input terminal, and a fourth source diffusion that includes a fourth output terminal;
    another gate, wherein a first portion of other gate is between the third source diffusion and the third drain diffusion, and wherein a second portion of the other gate is between the fourth source diffusion and the fourth drain diffusion; and
    another drain wire, to couple the third input terminal with the fourth input terminal;
    another source wire, to couple the third output terminal with the fourth output terminal;
  a third via, to couple the other input power wire with the third input terminal; and
  a fourth via, to couple the fourth output terminal with the output power wire.

15. The board of claim 13, wherein the power gate is a first power gate, the input transistor is a first transistor, and the output transistor is a second transistor, and wherein the processor further comprises:
  another input power wire;
  a second power gate, comprising:
    a third transistor, comprising a third drain diffusion that includes a third input terminal, and a third source diffusion that includes a third output terminal;
    a fourth transistor, comprising a fourth drain diffusion that includes a fourth input terminal, and a fourth source diffusion that includes a fourth output terminal,
    another gate, wherein a first portion of the other gate is between the third source diffusion and the third drain diffusion, and wherein a second portion of the other gate is between the fourth source diffusion and the fourth drain diffusion;
  another drain wire, to couple the third input terminal with the fourth input terminal; and
  another source wire, to couple the third output terminal with the fourth output terminal;
    another output power wire, wherein the fourth source diffusion is to couple the output terminal with the other output power wire;
  a third via, to couple the input power wire with the third input terminal; and
  a fourth via, to couple the fourth output terminal with the other output power wire.

* * * * *